United States Patent [19]

Burley

[11] Patent Number: 4,909,855

[45] Date of Patent: Mar. 20, 1990

[54] STABLE HIGH-TEMPERATURE THERMOCOUPLE CABLE

[75] Inventor: Noel A. Burley, Melbourne, Australia

[73] Assignee: Bell-IHR Limited, Lidcombe, Australia

[21] Appl. No.: 171,861

[22] Filed: Mar. 22, 1988

[30] Foreign Application Priority Data

May 14, 1987 [AU] Australia ................................ PI1909

[51] Int. Cl.$^4$ ............................................ H01L 35/14

[52] U.S. Cl. .................................... 136/239; 136/240; 136/242

[58] Field of Search ................................ 136/239–241, 136/242

[56] References Cited

U.S. PATENT DOCUMENTS

| | | | |
|---|---|---|---|
| 3,972,740 | 8/1976 | Starr et al. | 136/239 |
| 4,110,124 | 8/1978 | Robertson et al. | 136/241 X |
| 4,638,107 | 1/1987 | Davis | 136/237 |
| 4,647,710 | 3/1987 | Davis | 136/237 |

FOREIGN PATENT DOCUMENTS

| | | |
|---|---|---|
| 224433 | 7/1985 | Fed. Rep. of Germany . |

*Primary Examiner*—Peter A. Nelson
*Attorney, Agent, or Firm*—Armstrong, Nikaido, Marmelstein, Kubovcik & Murray

[57] ABSTRACT

A mineral-insulated metal sheathed cable comprising at least one type K thermoelement and characterized in that the sheath alloy consists essentially of up to about 40 weight-% chromium, up to about 10 weight-% niobium, about 0.5 to about 5.0 weight-% silicon, up to about 0.5 weight-% magnesium, up to about 0.3 weight-% cerium, and the balance nickel.

13 Claims, 1 Drawing Sheet

STABLE HIGH-TEMPERATURE THERMOCOUPLE CABLE

This invention relates to mineral-insulated integrally metal-sheathed electrically conductive cable, and devices made therefrom.

The cable of this invention is suitable for use as thermocouple cable and is particularly useful at high temperatures.

The invention utilises nickel-base alloys as sheath alloys, which are used in conjunction with conventional standard nickel-base alloy thermocouples designated type K by various national standards bodies such as the American National Standards Institute, the British Standards Institution, the International Electrotechnical Commission, and other such bodies.

In one aspect the invention provides nickel-base thermocouple cables, and nickel-base thermocouple sensor systems made therefrom, having superior oxidation resistance, greater longevity and greater thermoelectric stability under longer time periods and over a range of higher temperatures up to about 1200° C., than existing type K base-metal cables and sensor systems of the same general kind.

Nickel-base alloys have been used as thermocouples since the early part of this century. The most commonly used thermocouple of this kind is the type K thermocouple. The properties of type K thermocouples are well-known, and are summarized in the following references:

(1) NBS Monograph 125 "Thermocouple Reference Tables Based on the International Practical Temperature Scale (IPTS-68)", U.S. National Bureau of Standards, 1974. Column 1 on page 137 refers to compositional characteristics, while the thermal emf tables start at page 144.

(2) ASTM Annual Book of Standards, vol. 14.01 (1986): "Analytical Methods—Spectroscopy; Chromatography; Temperature Measurement; Computerized Systems". This document alludes, on page 242, to the compositional characteristics referred to in reference (1) above, and starts the emf tables on page 268.

(3) ISA American National Standard for Temperature Measurement Thermocouples, Ref. MC96.1 (1975). This document, referred to in (2) above, discusses compositions in column 2 of page V and in Table 1, and presents emfs in Tables XV and XVI.

The type K thermocouple is recommended to be used in an air atmosphere. At higher temperatures the type K thermocouple fails because of its relatively poor oxidation resistance. One way in which attempts have been made to overcome this problem is to incorporate the type K thermocouple in a compacted ceramic-insulated thermocouple sensor assembly.

As is well known in the art, a first step in the manufacture of such thermocouple sensors is to produce so-called MIMS (metal-sheathed mineral-insulated) cable, which comprises a sheath containing one or more thermoelement conductor wires electrically insulated from the sheath (and from each other when two or more conductor wires are used) by compacted mineral insulating material.

To make an actual sensor from this cable, the cable is cut and the ends of the conductors are exposed by removing some of the insulation therefrom. The exposed ends of the conductors are then joined to form a thermojunction, which may be accomplished, for example, by crimping and/or welding.

The thermocouple may simply be left exposed for use in appropriate environments, or may be protected by capping the sheath over the thermojunction, with or without insulant.

The MIMS type of thermocouple has come into common use because of certain advantageous features, including (i) chemical isolation of thermocouple wires from environments that may cause rapid deterioration;

(ii) electrical isolation of thermoelement conductors from sources of interference that may cause spurious signals;

(iii) mechanical protection of the thermocouple from damage due to pressure or shock;

(iv) mechanical flexibility of the assembly, allowing bending in installation; and (v) simple fabrication of thermocouples.

The sheath can be made from a material which, hopefully, is compatible with the environments and processes in which it is being used. There are numerous commercial suppliers of type K thermocouples in the compacted integrally metal-sheathed ceramic-insulated forms.

The full potential of the excellent MIMS design concept for type K thermocouples has not been realized. This is due to several factors associated with its development so far:

(i) The common sheath materials for type K MIMS thermocouples—the Inconels (Inconel is a trade mark) and the stainless steels—will not withstand exposure in air for extended periods of time at temperatures much above 1050° C. Most manufacturers of conventional type K MIMS thermocouples prescribed 1100° C. as the maximum operating temperature for their products. Unfortunately in many instances in industrial pyrometry there are specified operating temperatures in the range above 1100° C. for which conventional type K MIMS thermocouples are quite unsuitable.

(ii) The type K thermoelement conductor wires can be contaminated by chemical elements which thermally diffuse through the compacted insulant material from dissimilar sheath alloys such as stainless steel. It has been found that manganese emanating from the sheath, or even from one or both of the thermoelement conductor wires, is particularly potent as a contaminant by cross diffusion between sheath and conductors. The resultant change in the chemical compositions of the type K thermocouple alloys can cause substantial changes in their thermoelectromotive force (thermal emf). These changes in thermal emf are analogous with and algebraically additive to those caused by oxidation.

(iii) The type K thermoelement conductor wires, particularly the electronegative wire, may fail mechanically because of substantial alternating strains imposed during thermal cycling. These strains are caused primarily by longitudinal stresses which arise because of substantially different temperature coefficients of linear expansion of the thermoelements and stainless steel. Some typical average values of the coefficients of expansion are

| Component | Material | $\times 10^{-6}$ °C.$^{-1}$ (1000° C.) |
|---|---|---|
| sheath | stainless steel | 21 |
| thermoelements | type K | 17 |

As a result, there is a need for a new MIMS cable suitable for production of thermocouple sensors which are substantially free of the degradative influences described above and which demonstrate enhanced environmental and thermoelectric stability at temperatures significantly in excess of 100° C.

It is believed, therefore, that a new integrally metal-sheathed mineral-insulated cable, substantially free of degradative influences such as differential thermal stresses, and cross-contamination by diffusion, and demonstrating enhanced resistance to environmental interactions and to drifts in thermal emf at temperatures up to 1200° C. in a variety of different atmospheres would represent an advancement in the art.

OBJECTS AND SUMMARY OF THE INVENTION

It is one of the objects of this invention to provide an integrally metal-sheathed mineral-insulated (MIMS) type K thermocouple cable and sensor which is thermoelectrically stable up to 1200° C. It is a further object of this invention to provide an integral compacted base-metal thermocouple cable and sensor which are highly oxidation resistant up to 1200° C.

These and other objects of this invention are achieved by the use of certain specific alloys, and certain other compositional variants of these alloys, as MIMS sheath materials. We have now surprisingly found that the use of the type N alloys Nicrosil and Nisil and compositional variants thereof as the sheath material provides an unexpected benefit to the performance of the type K thermoelements. The specific compositions and properties of the type N alloys Nicrosil and Nisil are well known and are summarized in the following reference:—NBS Monograph 161 "The Nicrosil versus Nisil Thermocouple, Properties and Thermoelectric Reference Data", U.S. National Bureau of Standards, 1968.

The invention accordingly provides a mineral-insulated metal sheathed cable comprising at least one type K thermoelement and characterised in that the sheath alloy is of the following composition: up to about 40 weight-% chromium, up to about 10 weight-% niobium, about 0.5 to 5.0 weight-% silicon, up to about 0.5 weight-% magnesium, up to about 0.3 weight-% cerium, and the balance nickel (apart from metallurgically acceptable levels of impurities).

It will be clearly understood that the sheath alloy includes within its scope Nicrosil and Nisil, and the alloys disclosed in Australian Patent Application Nos. 41675/85 and 62404/86 by the present applicant.

A preferred sheath alloy of this invention consists essentially of from about 13 weight percent to about 15 weight percent of chromium, from zero to about 10 weight percent of niobium, from about 0.5 weight percent to about 3.5 weight percent of silicon, from zero weight percent to about 0.3 weight percent of magnesium, from zero to about 0.3 weight percent of cerium, and the balance nickel.

The preferred type K thermocouple conductors for the MIMS able of this invention are those commercial varieties which are available which contain no manganese in their chemical compositions.

Preferred refractory mineral-insulating materials for the MIMS thermocouple cable include magnesium oxide, aluminium oxide, beryllium oxide and other suitable refractory oxides.

Preferably, in order to reduce the oxidation of the type K thermoelement alloys, air is removed from the interstices of the mineral-insulate powder grains and replaced by an inert gas such as argon and nitrogen.

DETAILED DESCRIPTION OF THE PREFERRED EMBODIMENTS

Figure 1:
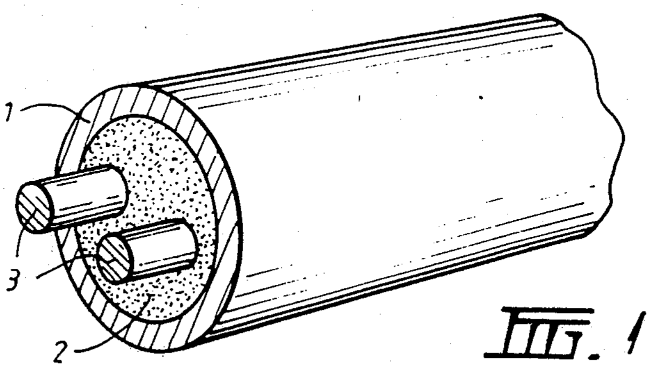

For a better understanding of the present invention together with other and further objects, advantages, and capabilities thereof, reference is made to the following disclosure, and to the accompanying drawings, in which:

FIG. 1 represents a typical MIMS cable containing two conductor wires; and

Figure 2:
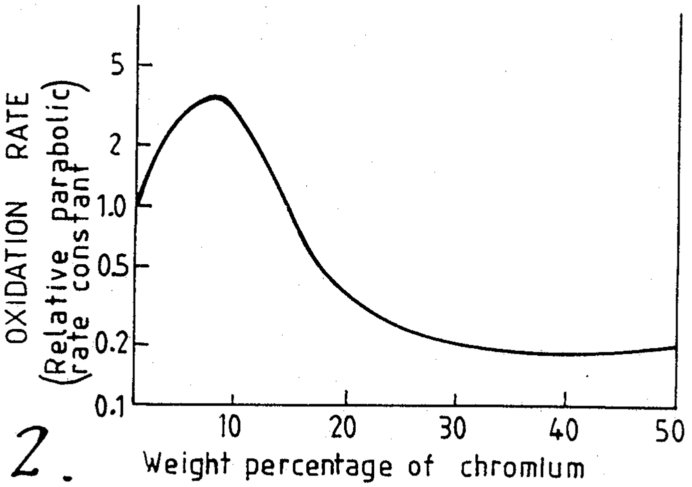

FIG. 2 represents the relative oxidation resistance of nickel-chromium binary alloys The structure of a typical conventional MIMS thermocouple is illustrated in FIG. 1, showing an integral sheath 1, usually made from stainless steel or Inconel, containing mineral insulation 2 which surrounds thermoelement conductor wires 3. The mineral insulation material is usually magnesium oxide, and the thermoelement wires are usually type K alloy.

The integral base-metal thermocouple cable of the present invention has excellent oxidation resistance and thermoelectric stability at temperatures up to 1200° C.

It has been found that the alloys of this invention change very little both in thermal emf output and degree of oxidation even after exposure at 1200° C. When compared with the conventional thermoalloys of type K and sheath alloys of Inconel and stainless steel, which materials are conventionally used in existing integral compacted thermocouple sensors, the integral compacted thermocouple sensor of this invention incorporating the type K thermoelements and sheath alloys described above shows markedly improved thermoelectric and environmental stability, to a degree hitherto unattainable with conventionally-used type K integrally metal-sheathed mineral-insulated thermocouples.

The sheath alloys to be incorporated in this invention have preferred compositions (i) from about 13.9 weight percent to about 14.5 weight percent chromium, from about 1.3 weight percent to about 1.5 weight percent of silicon, and the balance nickel, or more preferably (ii) from about 14.05 weight percent to about 14.35 weight percent of chromium, from about 1.35 weight percent to about 1.45 weight percent of silicon, and the balance nickel;

(iii) from about 13.9 weight percent to about 14.5 weight percent of chromium, from about 1.0 weight percent to about 5.0 weight percent of niobium, from about 0.05 weight percent to about 0.20 weight percent of magnesium, from about zero weight percent to about 0.2 weight percent of cerium, and the balance nickel, or more preferably (iv) from about 14.05 weight percent to about 14.35 weight percent chromium, from about 1.5 weight percent to about 3.0 weight percent of niobium, from about 1.35 percent weight to about 1.45 percent of silicon, from about 0.10 weight percent to about 0.20 weight percent of magnesium, from zero weight percent to about 0.1 weight percent of cerium and the balance nickel.

Two specific preferred compositions of the above sheath alloys, within the usual limits of manufacturing tolerance, consist essentially (in weight percentages) of

| Alloy (V) | Element | Alloy (V1) |
|---|---|---|
| 14.2 | Cr | 14.2 |
| — | Nb | 2.5 |
| 1.4 | Si | 1.4 |
| — | Mg | 0.15 |
| — | Ce | 0.04 |
| balance | Ni | balance |

The alloy (V1) is a higher-tensile strength alloy than (V) by virtue of the niobium content of the former. The alloy (V1) has somewhat superior oxidation resistance to alloy (V), due to the presence of small quantities of magnesium and cerium in the latter. The effects of niobium, magnesium and cerium on these respective properties of Ni-Cr-Si alloys are well known in the art.

Experimental measurements have shown that the oxidation resistance of the Ni-Cr-Si base is improved by increasing the chromium content, over a wide range of chromium contents above the critical internal-to-external oxidation transition composition of about 12 weight percent. This is illustrated in FIG. 2.

Thus the chromium content of the Ni-Cr-Si base can be broadened to cover the range 10 to 40 weight percent Cr. Similar considerations apply to the silicon content of the Ni-Cr-Si base, so that it can be broadened to cover the range 0.5 to 5.0 weight percent Si.

Further, the solid-solution strengthening effect of the element niobium is efficaceous over its whole range of solid solubility in the Ni-Cr-Si base, so that its concentration can cover the range up to ten weight percent.

For the reasons explained above, the sheath alloy of this invention may therefore be compositionally variant with respect to its component elements to a greater degree than is indicated for the preferred embodiments so far stated. A further group of preferred embodiments of the alloys of this invention is therefore described as follows

| Element (Symbol) | Concentration (Weight percent) |
|---|---|
| Cr | 40 maximum |
| Nb | 10 maximum |
| Si | 0.5 to 5.0 |
| Mg | 0.5 maximum |
| Ce | 0.2 maximum |
| Ni | remainder apart from impurities. |

The invention will be further illustrated by reference to the following non-limiting examples.

EXAMPLE 1

The integral compacted thermocouple cable of this example is fabricated using existing manufacturing procedures. These begin with thermoelectrically matched thermoelement wires surround by non-compacted ceramic insulating material held within a metal tube. By rolling, drawing, swageing, or other mechanical reduction processes the tube is reduced in diameter and the insulation is compacted around the wires. The manufacturing process parameters are adjusted so that the ratios of sheath diameter to wire-size and sheath wall-thickness offer a balance between maximum wall-thickness and suitable insulation spacing for effective insulation resistance at elevated temperatures.

An important feature of the fabrication process is that considerable attention is given to the initial cleanliness and chemical purity of the components and to maintenance of a high degree of cleanliness and dryness throughout fabrication. As already noted above, to make an actual sensor from this cable, the cable is cut and the ends of the conductors are exposed by removing some of the insulation therefrom. The exposed ends of the conductors are then joined to form a thermojunction, which may be accomplished for example by crimping and/or welding.

The thermojunction may simply be left exposed for use in appropriate environments, or may be protected by capping the sheath over the thermojunction with or without insulant. The measuring thermojunction of the thermocouple is usually, but not always, electrically isolated from the end of the sheath.

In this example, the alloys for the thermocouple conductor wires are those specified above as type K and the alloy for the sheath is that specified as alloy (v) above, i.e. Ni-14.2Cr-1.4Si.

An important feature of the finished product of this example is that the essential similarity between the composition and high-temperature properties of the sheath alloy and the thermocouple conductor alloys substantialiy attenuates the destructive influences of thermocouple contamination by cross-diffusion, mechanical (fatigue) failure due to differential thermal stresses, and accelerated oxidation above about 1000° C., which occur when dissimilar and inappropriate sheath alloys like the stainless steels are used.

The strains caused by longitudinal stresses arising during thermal cycling, which cause mechanical failures, are reduced by about an order of magnitude because of the very small differences in temperature coefficient of linear expansion between the materials of the sheath of this invention and of the type K thermoelement conductors.

Some typical values of these coefficients of expansion are:

| Component | Material | $\times 10^{-6}$ °C.$^{-1}$ (1200° C.) |
|---|---|---|
| sheath | Ni—14.2Cr—1.4Si | 17.5 |
| thermoalloys | type K | 17 (average of positive and negative alloy) |

It will be clearly understood that the invention in its general aspects is not limited to the specific details referred to hereinabove.

The claims defining the invention are as follows:

1. A mineral-insulated metal sheathed cable comprising at least one type K thermoelement and characterised in that the sheath alloy consists essentially of from about 13.9 weight percent to about 14.5 weight percent chromium, from about 1.3 weight percent to about 1.5 weight percent of silicon, and the balance nickel.

2. A cable according to claim 1 in which the sheath alloy consists essentially of from about 14.05 weight percent to about 14.35 weight percent of chromium, from about 1.35 weight percent to about 1.45 weight percent of silicon, and the balance nickel.

3. A mineral-insulated metal sheathed cable comprising at least one type K thermoelement and characterised in that the sheath alloy consists essentially of up to about 40 weight-% chromium, up to about 10 weight-% niobium, about 0.5 to about 5.0 weight-% silicon, up to about 0.5 weight-% magnesium, up to about 0.3 weight-% cerium, and the balance nickel.

4. A cable according to claim 3 in which the sheath alloy consists essentially of from about 13 weight percent to about 15 weight percent of chromium, from zero to about 10 weight percent of niobium, from about 0.5 weight percent to about 3.5 weight percent of silicon, from zero weight percent to about 0.3 weight percent of magnesium, from zero to about 0.3 weight percent of cerium, and the balance nickel.

5. A cable according to claim 4 in which the sheath alloy consists essentially of from about 13.9 weight percent to about 14.5 weight percent of chromium, from about 1.3 weight percent to about 1.5 weight percent of silicon, from about 1.0 weight percent to about 5.0 weight percent of niobium, from about 0.05 weight percent to about 0.20 weight percent of magnesium, from about zero weight percent to about 0.2 weight percent of cerium, and the balance nickel.

6. A cable according to claim 5, in which the sheath alloy consists essentially of from about 14.05 weight percent to about 14.35 weight percent chromium, from about 1.5 weight percent to about 3.0 weight percent of niobium, from about 1.35 percent weight to about 1.45 percent of silicon, from about 0.10 weight percent to about 0.20 weight percent of magnesium, from zero weight percent to about 0.1 weight percent of cerium and the balance nickel.

7. A cable according to claim 1 in which the sheath alloy consists essentially of 14.2 weight percent chromium, 1.4 weight percent silicon, and the balance nickel.

8. A cable according to claim 3 in which the sheath alloy consists essentially of 14.2 weight percent chromium, 2.5 weight percent niobium, 1.4 weight percent silicon, 0.15 weight percent magnesium, 0.04 weight percent cerium, and the balance nickel.

9. A cable according to claim 1 in which the sheath alloy is Nisil.

10. A cable according to claim 3 in which the sheath alloy is Nicrosil.

11. A cable according to any one of the preceding claims in which the type K thermoelement contains no manganese.

12. A cable according to any one of the preceding claims in which the mineral insulating material is selected from magnesium oxide, beryllium oxide and aluminium oxide.

13. A cable according to any one of the preceding claims in which air in the mineral insulation is replaced by an inert gas.

* * * * *